United States Patent [19]
Yokoyama

[11] 3,986,134
[45] Oct. 12, 1976

[54] PUSH-PULL AMPLIFIER CIRCUITRY
[75] Inventor: Kenji Yokoyama, Hamamatsu, Japan
[73] Assignee: Nippon Gakki Seizo Kabushiki Kaisha, Japan
[22] Filed: Aug. 15, 1975
[21] Appl. No.: 605,172

[30] Foreign Application Priority Data
  Aug. 23, 1974 Japan................................ 49-96773

[52] U.S. Cl.................................... 330/35; 330/13; 330/15; 330/18; 330/19; 330/28; 330/30 D
[51] Int. Cl.²......................................... H03F 3/16
[58] Field of Search ............... 330/13, 15, 19, 30 D, 330/28, 35, 18

[56] References Cited
  UNITED STATES PATENTS
  3,914,702  10/1975  Giehweiler........................ 330/35 X

*Primary Examiner*—James B. Mullins
*Attorney, Agent, or Firm*—Cushman, Darby & Cushman

[57] ABSTRACT

A push-pull amplifier circuitry comprising: a first and a second FET (abbreviation of field effect transistor which will be used hereinafter) of an n-channel type, a third FET of a p-channel type with its gate and source connected to the gate of said first FET and to the source of said second FET respectively, a fourth FET of a p-channel type having a gate and a source connected to the gate of said second FET and to the source of said first FET, a positive voltage supply connected to the drain of said first FET and via a resistor to the drain of said second FET and, a negative voltage supply connected to the drain of said third FET and via another resistor to the drain of said fourth FET. This circuitry is suitable for use as an input stage or an interstage amplifier circuit such as a pre-driver of a multistage direct-coupled push-pull amplifier.

7 Claims, 3 Drawing Figures

PUSH-PULL AMPLIFIER CIRCUITRY

BACKGROUND OF THE INVENTION a. Field of the Invention

This invention relates to a push-pull amplifier circuitry, and more particularly to a simplified circuit arrangement for a multistage direct-coupled push-pull amplifier employing complementary symmetry FET's.

b. Brief description of the Prior Art

Currently known transistorized power amplifiers almost invariably adopt either the full stage direct-coupled circuit configuration, the dual power source system or the pure complementary push-pull circuit configuration which uses complementary symmetry bipolor transistors.

However, there has already hardly been proposed a power amplifier which is constructed by the use of FET's throughout the entire circuitry thereof. This is mainly because of the fact that an FET of a p-channel type is difficult to manufacture and that there has not yet been developed a power FET which is suitable for being employed in the power stage of a power amplifier.

Recently, however, by an application of the known selective oxidization technique which is utilized in the manufacture of large-scale integrated circuits, it has become possible to produce FET's of a p-channel type in a large number on an industrial basis, and along therewith vertical junction-type FET's have come to be put into practice as power FET's. Thus, the conditions for putting into practice a power amplifier which is constructed by the use of FET's entirely in the circuitry as a whole have now become matured.

If, however, these conditions are to follow the circuit configuration of the known power amplifier which employs the conventional bipolar transistors of the current control type, it is not necessarily possible to make full use of the advantageous features of FET's of being controlled by voltage. In particular, an FET is, by nature, not easily affected by the ambient temperature as compared with a bipolar transistor, so that it hardly needs the provision of such means as for making compensation for the variation of the DC bias caused by the variation of ambient temperature. As such, the power amplifier using FET's ought to be constructed by placing an importance on such matters as the simplification of circuit construction, the gain increase, and an improvement in the frequency characteristic.

SUMMARY OF THE INVENTION

It is, therefore, an object of the present invention to provide a multistage direct-coupled push-pull amplifier employing complementary symmetry FET's.

Another object of the present invention is to provide a simplified circuit configuration of the push-pull amplifier of the type described above.

Still another object of the present invention is to provide a push-pull amplifier circuitry which is suitable for use as an input stage amplifier circuit or an interstage amplifier circuit of the push-pull amplifier of the type described above.

DETAILED DESCRIPTION OF THE PREFERRED EMBODIMENTS

Figure 1:
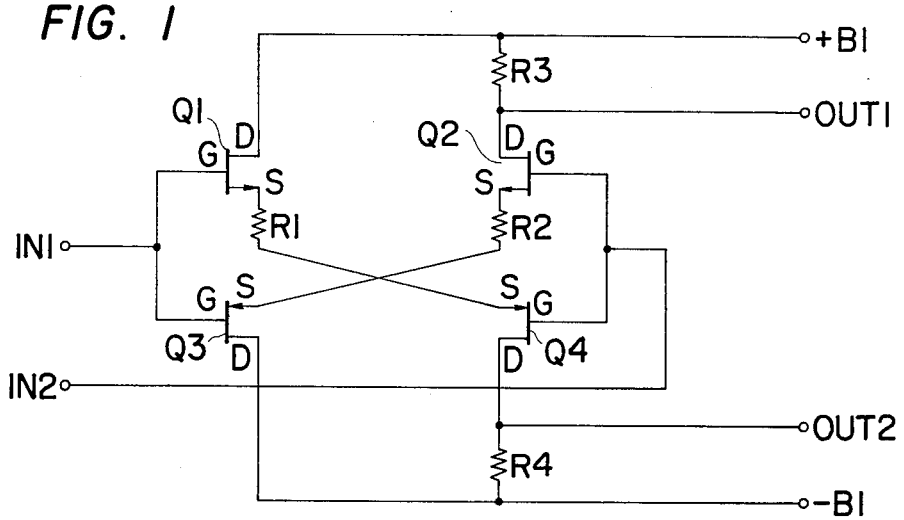
FIG. 1 is an example of a push-pull amplifier circuitry according to the present invention.

Referring now to the drawings, FIG. 1 shows an example of a push-pull amplifier circuitry according to the present invention.

A first FET Q1 of an n-channel type and a third FET Q3 of a p-channel type have a common connection at their gates to form a first input terminal IN1 of the circuitry, and a second FET Q2 of an n-channel type and a fourth FET Q4 of a p-channel type have a common connection to form a second input terminal IN2 of the circuitry. A positive voltage supply +B1 is connected to the drain of the first FET Q1 and via a resistor R3 to the drain of the second FET Q2, and a negative voltage supply −B1 is connected to the drain of the third FET Q3 and through a resistor R4 of the same resistance as that of the resistor R3 to the drain of the fourth FET Q4. In series between the sources of the first and the fourth FET's Q1 and Q4 and between the sources of the second and the third FET's Q2 and Q3 are connected resistors R1 and R2 both having the same resistance. There are provided a first and a second output terminals OUT1 and OUT2 of this circuitry at the drains of the second and the fourth FET's Q2 and Q4.

The operation of this push-pull amplifier circuitry is described as follows. A positive half input signal applied to the first input terminal IN1 turns the FET's Q1 and Q4 "on" and causes a current to flow through the FET's Q1 and Q4 and the resistor R4. Thus, a positive half output signal appears at the second output terminal OUT2. On the other hand, a negative half input signal applied to the first input terminal IN1 turns the FET's Q2 and Q3 "on" to derive a negative half output signal at the first output terminal OUT1.

In case the absolute values of the output voltages of both voltage supplies +B1 and −B1 are equal to each other, this circuitry delivers the output signals at the output terminals OUT1 and OUT 2 which are equal in their amplitudes and phases and different in their DC levels. And also, the DC levels at both input terminals IN1 and IN2 may be equal to each other regardless of the DC levels at the output terminals OUT1 and OUT2. Accordingly, this circuitry can have a simplified circuit arrangement of a multistage direct-coupled push-pull amplifier, if this circuitry is employed in the input stage or the interstage of a multistage direct-coupled push-pull amplifier. This will be made apparent from the following description.

Figure 2:
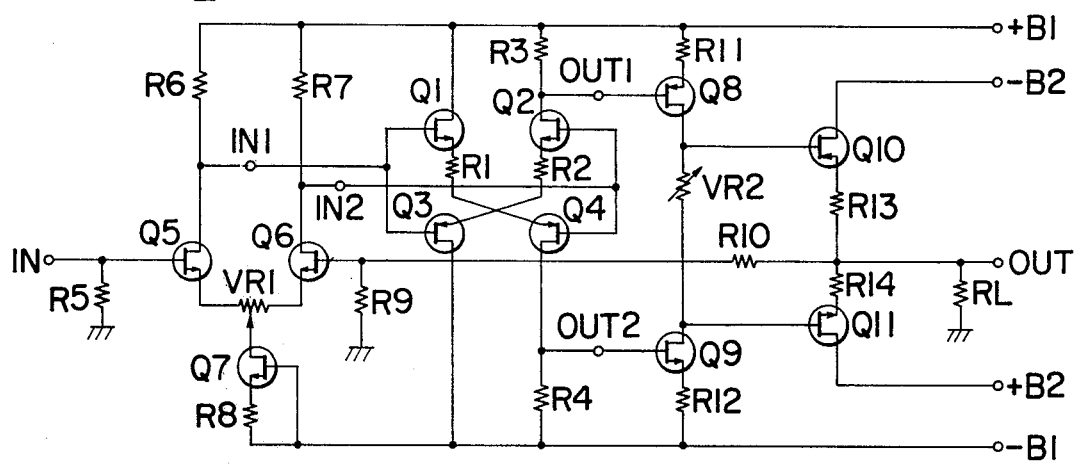
FIG. 2 is an example of a four-stage direct-coupled push-pull amplifier of the present invention employing the amplifier circuitry of FIG. 1 in the predriver stage.

Description will hereunder be made on an example of a four-stage direct-coupled push-pull amplifier of the present invention employing the circuitry of FIG. 1 in the pre-driver stage, by referring to FIG. 2. In this amplifier, the input stage is composed of a differential amplifier circuit whose arrangement will be described as follows. A pair of FET's of an n-channel type Q5 and Q6 have their sources connected to the opposite ends of a rheostat VR1 and have their drains connected via resistors R6 and R7 to the positive voltage supply +B1. The slider tap of the rheostat VR1 is connected to the negative voltage supply −B1 through a constant current circuit composed of an FET of an n-channel type Q7 and a resistor R8 inserted in series in the source circuit of the FET Q7. The gate of the FET Q5 is connected to an input terminal IN of the amplifier and is grounded via a resistor R5, while the gate of the FET Q6 is grounded via a resistor R9.

The pre-driver stage is composed of the push-pull amplifier circuitry illustrated in FIG. 1 and, therefore, its detailed description is omitted here. The first and the second input terminals IN1 and IN2 of this pre-driver stage are directly connected to the drains of the FET's Q5 and Q6, i.e., the output terminals of the input-stage. This is because of the fact that the DC potentials at the drains of the FET's Q5 and Q6 can be set equal of each other by an adjustment of the rheostat VR1, and that the output signals at these drains are opposite in phase and is equal in magnitude.

The driver stage of the amplifier is of the arrangement that FET's of a p-channel type and n-channel type Q8 and Q9 forming a pair of connected in series via a variable resistor VR2 connected between their drains, and the sources of the FET's Q8 and Q9 are connected via resistors R11 and R12 to the voltage supplies +B1 and −B1, respectively. This driver stage circuit operates in a mode of A-class amplification, and its input terminals, i.e., the gates of the FET's Q8 and Q9, are direct-coupled to the corresponding output terminals of the pre-driver stage, namely the drains of the FET's Q2 and Q4. The variable resistor VR2 is adjusted to set the FET's Q10 and Q11 at the optimum quiescent operating points.

The power-stage of the amplifier is the known complementary single-ended push-pull amplifier circuit of the so-called source-follower configuration. More specifically, this power-stage is composed of: a power FET of a p-channel type Q10 with its drain, gate and source electrodes connected to another negative voltage supply −B2, and to the drain of the FET Q8, and, via a resistor, R13 further to an output terminal of the amplifier; and an FET of an n-channel type Q11 with its drain, gate and source connected respectively to another positive voltage supply +B2, and to the drain of the FET Q9, and, via a resistor R14, further to the output terminal OUT. Between the output terminal and the ground is connected a load RL of the amplifier, and between the output terminal and the gate of the FET Q6 is connected through a resistor R10 to form a negative feedback network together with said resistor R9 for feeding back a part of the output signal which is delivered at the output terminal OUT. Since this feedback network is composed only of resistors R9 and R10, it is possible to feed back the variation DC potential at the output terminal OUT. As a result, the stability in the DC bias throughout the entire stages is improved.

Figure 3:
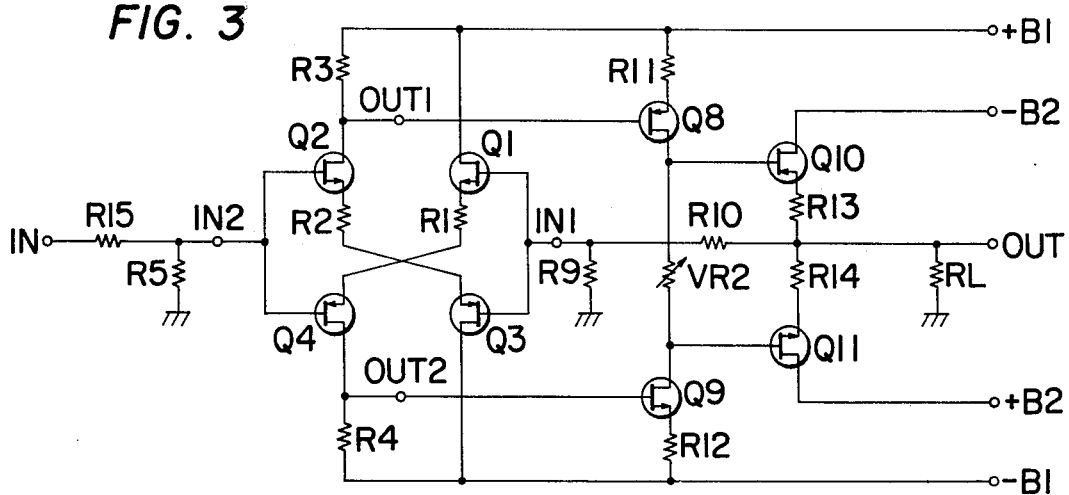
FIG. 3 is another example of a three-stage direct-coupled push-pull amplifier of the present invention utilizing the amplifier circuitry of FIG. 1 in the input stage.

FIG. 3 shows another example of a direct-coupled push-pull amplifier of the present invention. This amplifier is composed of direct-coupled three stages; an input-, a driver- and a power-stages. In this amplifier, the push-pull amplifier circuitry of FIG. 1 is used as the input-stage amplifier circuit, and the input terminal IN of the amplifier is connected via a resistor R15 to the second input terminal IN2 of the input stage amplifier circuit, and the output signal is fed back to the first input terminal IN1 of the input-stage amplifier circuit. The driver-stage and the power-stage have the same arrangements as those of the amplifier described in FIG. 2, and their detailed description is therefore omitted.

I claim:
1. A push-pull amplifier circuitry comprising:
a first and a second field effect transistor (FET) of an n-channel type both having a gate electrode, a drain electrode and a source electrode;
a third FET of a p-channel type having a gate electrode and a source electrode connected to the gate electrode of said first FET and to the source electrode of said second FET, respectively, and having a drain electrode;
a fourth FET of a p-channel type having a gate electrode and a source electrode connected to the gate electrode of said second FET and to the source electrode of said first FET, respectively, and having a drain electrode;
a positive voltage supply connected to the drain electrode of said first FET and via a first resistor to the drain electrode of said second FET;
a negative voltage supply connected to the drain electrode of said third FET and via a second resistor to the drain electrode of said fourth FET;
a first input terminal of said push-pull amplifier circuitry connected to the coupled gate electrodes of said first and said third FET's;
a second input terminal of said push-pull amplifier circuitry connected to the coupled gate electrodes of said second and said fourth FET's;
a first output terminal of said push-pull amplifier circuitry connected to the drain electrode of said second FET and,
a second output terminal of said push-pull amplifier circuitry connected to the drain electrode of said fourth FET.

2. A push-pull amplifier circuitry according to claim 1, further comprising:
a third resistor connected in series between the source electrodes of said first and said fourth FET's and,
a fourth resistor connected in series between the source electrodes of said second and said third FET's.

3. A push-pull amplifier circuitry according to claim 1, in which:
said first and said second resistors both have a same resistance and,
said positive and said negative voltage supplies both generate a same absolute value of the output voltage.

4. A push-pull amplifier circuitry according to claim 2, in which:
said first and said second resistors both have a same resistance,
said third and said fourth resistors both have a same resistance and,
said positive and said negative voltage supplies both generate a same absolute value of the output voltage.

5. A push-pull amplifier circuitry according to claim 1 employed in the pre-driver stage of a four-stage direct-coupled push-pull amplifier, in which the amplifier circuitry further comprises:
An input stage including a fifth and sixth FET of an n-channel type both having source electrodes connected respectively via a constant current circuit to said negative voltage supply, and having drain electrodes connected respectively via resistors to said positive voltage supply and direct-coupled with said first and second input terminals of the pre-driver stage, and both having gate electrodes;

an input terminal of said direct-coupled amplifier connected to the gate electrode of said fifth FET;

a driver stage including a seventh and an eighth FET respectively being a p-channel and an n-channel type and both having their drain electrodes connected to each other via a variable resistor, and having source electrodes connected respectively via a resistor to said positive and negative voltage supplies, and having their gate electrodes direct-coupled respectively to said first and said second output terminals of the pre-driver stage;

a power stage including a ninth FET of p-channel type and a tenth FET of an n-channel type both having their gate electrodes of said seventh and said eighth FET's in the drive stage, and having drain electrodes connected respectively to another negative and another positive voltage supplies, and having their source electrodes connected respectively to an output terminal of the direct-coupled amplifier;

a load connected between said output terminal and a ground; and a resistor network composed of a plurality of resistors connected between said output terminal and the gate electrode of said sixth FET.

6. A push-pull amplifier circuitry according to claim 5, in which said constant current circuit comprises an FET of an n-channel type having its gate electrode and source electrode connected to said negative voltage supply and, via a resistor, to said negative voltage supply, and its drain electrode connected to a sliding tap of a rheostat whose opposite ends are connected across the sources of said fifth and sixth FET's.

7. A push-pull amplifier circuitry according to claim 1 employed in the input stage of a three-stage direct-coupled push-pull amplifier, in which the amplifier circuitry further comprises:

an input terminal of the direct-coupled amplifier which is connected to said second input terminal of the input stage;

a driver stage including an FET of a p-channel type and an FET of an n-channel type both having their drain electrodes connected to each other via a variable resistor, and having their source electrodes connected via a resistor to said positive and said negative voltage supplies respectively, and having their gate electrodes direct-coupled to said first and said second output terminals, respectively, of the input stage;

a power stage including an FET of a p-channel type and an FET of an n-channel type both having their gate electrodes direct-coupled to the drain electrodes, respectively, of said FET's in the driver stage, and having their drain electrodes connected to another negative voltage supply and to another positive voltage supply, respectively, and having their source electrodes connected together to an output terminal of the direct-coupled amplifier, a load connected between said output terminal and a ground, and a resistor network composed of a plurality of resistors connected between said output terminal and the first input terminal in the input stage.

* * * * *